United States Patent
Roehr et al.

(10) Patent No.: US 6,906,969 B2
(45) Date of Patent: Jun. 14, 2005

(54) HYBRID FUSES FOR REDUNDANCY

(75) Inventors: Thomas Roehr, Kanagawa (JP);
Hans-Oliver Joachim, Kanagawa (JP);
Norbert Rehm, Kanagawa (JP);
Tadashi Miyakawa, Tokyo (JP)

(73) Assignees: Infineon Technologies Aktiengesellschaft, Munich (DE);
Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 10/065,169

(22) Filed: Sep. 24, 2002

(65) Prior Publication Data

US 2004/0057293 A1 Mar. 25, 2004

(51) Int. Cl.⁷ ................................................ G11C 7/00
(52) U.S. Cl. ................ 365/200; 365/230.03; 365/225.7
(58) Field of Search ........................... 365/200, 230.03, 365/225.7

(56) References Cited

U.S. PATENT DOCUMENTS

| | | | | | |
|---|---|---|---|---|---|
| 5,892,718 | A | * | 4/1999 | Yamada | 365/200 |
| 6,166,981 | A | * | 12/2000 | Kirihata et al. | 365/225.7 |
| 6,269,035 | B1 | * | 7/2001 | Cowles et al. | 365/200 |
| 6,288,436 | B1 | | 9/2001 | Narayan et al. | 257/529 |
| 6,363,021 | B2 | * | 3/2002 | Noh | 365/200 |
| 6,590,814 | B1 | * | 7/2003 | Kwak | 365/200 |
| 2002/0000837 | A1 | | 1/2002 | Keeth et al. | 327/51 |
| 2002/0006062 | A1 | | 1/2002 | Otori et al. | 365/189.07 |

* cited by examiner

Primary Examiner—Richard Elms
Assistant Examiner—Pho M. Luu
(74) Attorney, Agent, or Firm—Horizon IP Pte Ltd

(57) ABSTRACT

A redundancy unit includes first and second fuse blocks for programming the redundancy element. One fuse block has laser blowable fuses and the other electrical fuses. The redundancy unit can be programmed by either one of the fuse blocks, enabling the redundancy unit to able to be used for defects identified before packaging and as well as after.

49 Claims, 5 Drawing Sheets

204

HYBRID FUSES FOR REDUNDANCY

BACKGROUND OF INVENTION

An IC may include a memory array having a plurality of memory cells interconnected by bitlines in first (column) and wordlines in second (row) directions. The array can be organized in a plurality of memory blocks. During fabrication of the IC, one or more memory cells can be defective. To repair the defective cells, redundant memory cells are provided.

FIG. 1 shows a block 101 of redundant cells for repairing defective cells in the memory array. As shown, the block comprises a plurality of redundant elements 120a–h. A redundant element typically comprises a plurality of cells configured for row and/or column redundancy. Typically, the memory array is separated into memory elements corresponding to the redundant elements. When a defect occurs in a memory element, it is replaced with a redundant element. Each redundant element is associated with a fuse block 132 from a fuse bank 130. As used herein, a redundant element and associated fuse block is referred to as a "redundancy unit". A fuse block includes a plurality of fuses to facilitate redundancy. The use of fuses to facilitate redundancy is described in, for example, Taylor et al., IEEE JSSC, Vol. SC-20, No. 5 (October, 1985), which is herein incorporated by reference for all purposes.

Conventionally, the fuses can be either laser or electrically blowable fuses. Laser type fuses are used to repair defects prior to packaging. For example, after the IC is fabricated, the IC is tested at the wafer level (i.e., prior to dicing). Defective cells are identified and repaired with redundant elements by blowing the fuses using a laser. An electrical type fuse, on the other hand, is blown by sending an electrical current which exceeds the capacity of the fuse, thereby blowing it. Electrical fuses are used to repair defective cells after the IC is packaged.

To provide repairs both before and after packaging both types of fuse blocks (e.g., laser and electrical) are provided, each associated with a redundant element. However, unused laser type redundant elements cannot be used after the IC is packaged. This results in an inefficient use of chip area, which increases manufacturing costs as well as chip size.

From the foregoing discussion, it is desirable to provide an improved redundancy scheme that reduce costs and chip size.

SUMMARY OF INVENTION

The invention relates to redundancy units for repairing defects in ICs. In one embodiment, a redundancy unit comprising first and second fuse blocks associated with a redundant element is described. The first fuse block comprises at least one first fuse and the second fuse block comprises at least one second fuse. The first fuse is a laser blowable fuse and the second fuse is an electrical fuse. In one embodiment, the electrical fuse is an electrically blowable fuse. The redundancy unit can be programmed for redundancy by either of the fuse blocks.

In one embodiment, the first fuse block is used to program the redundancy unit prior to packaging of the IC and the second redundancy unit can be used to program redundancy unit after the IC is packaged. In one embodiment, a selection circuit is used to select between the first fuse block or second fuse block to program the redundancy unit. The selection circuit comprises, in one embodiment, an OR or XOR gate.

By providing first and second fuse blocks associated with a redundant element, the redundancy unit can be used (e.g., programmed) before or after packaging. This increases flexibility and efficiency of the redundancy scheme, thus increasing yields.

DETAILED DESCRIPTION

Figure 1:
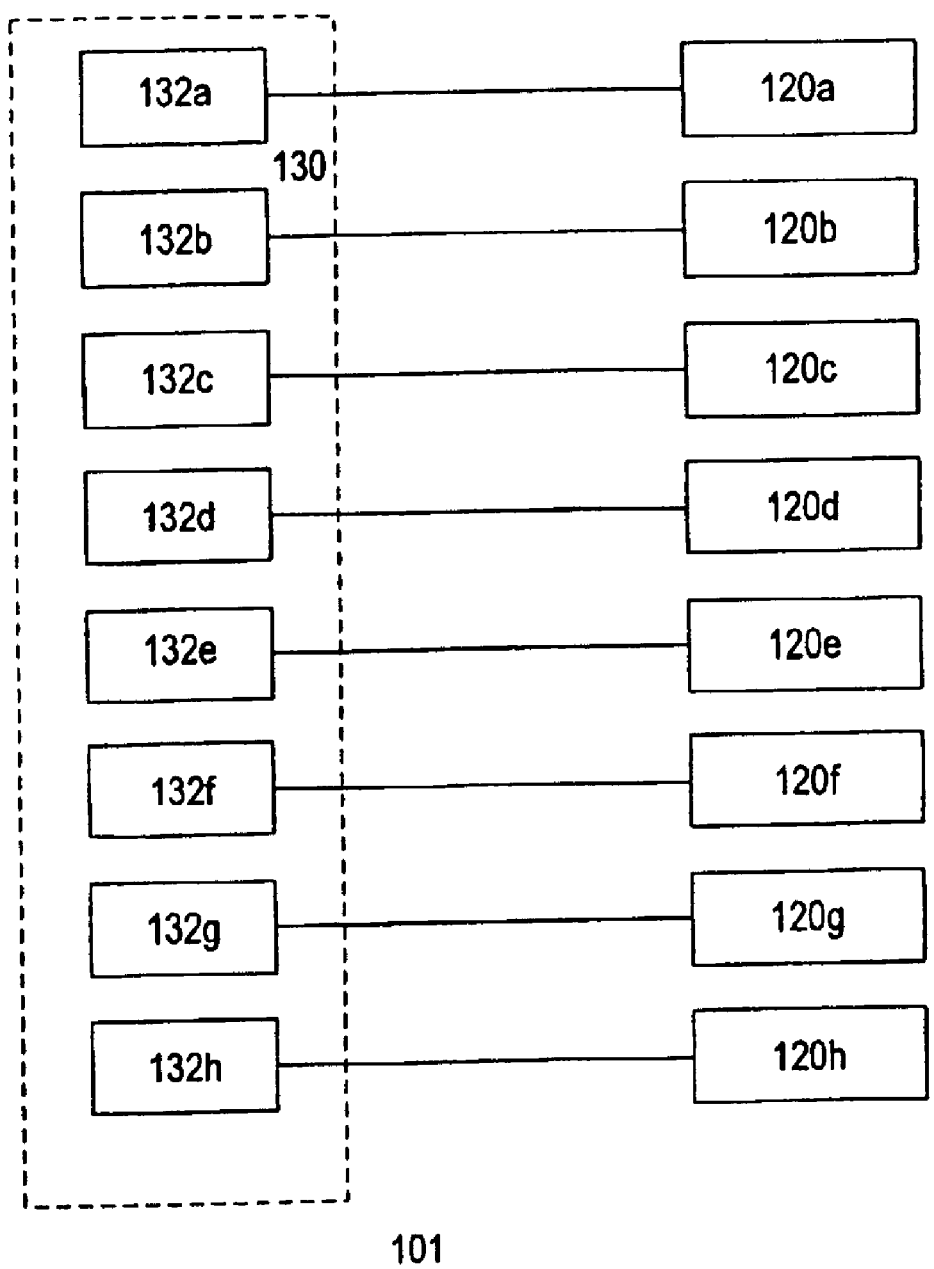
FIG. 1 shows a conventional memory redundancy scheme in an IC.
Figure 2:
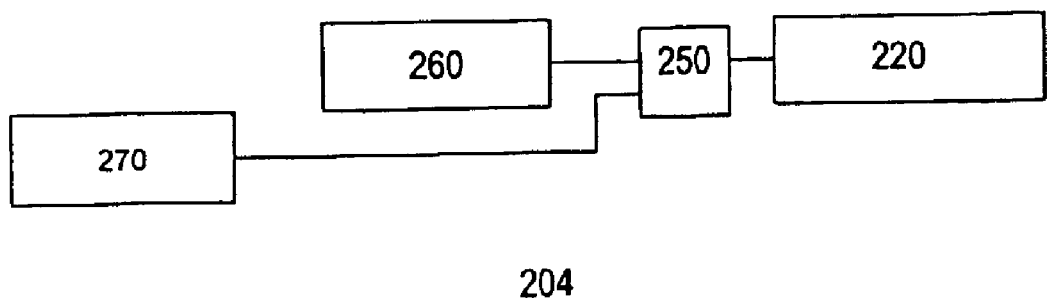
FIG. 2 shows a redundancy scheme in accordance with one embodiment of the invention.

FIG. 2 shows a redundancy unit 204 in accordance with one embodiment of the invention. As shown, the redundant unit comprises a redundant element 220. The redundant element can comprise a plurality of memory cells for row and/or column redundancy. The granularity of the redundant element can be chosen to accommodate design needs. For example, a redundant element can be designed to replace a group of rows, columns, or cells. The redundant element can also be designed to replace a single memory cell. The memory cells, in one embodiment, comprise ferroelectric memory cells. Other types of memory cells are also useful. Also, the memory cells can be arranged in a series architecture. A series memory architecture is described in, for example, A Sub-40 ns Chain FRAM Architecture with 7 ns Cell-Plate-line Drive" IEEE JSSC, Vol. 34, no. 11, which is herein incorporated by reference for all purposes. Other types of architectures are also useful.

In one embodiment, the redundant element is associated with first and second fuse blocks 260 and 270. One fuse block comprises a first type of fuses while the other comprises a second type of fuses. In one embodiment, the first fuse block comprises laser-blowable fuses and the second fuse block comprises electrical fuses. The electrical fuses, for example, are electrically blowable fuses. Other types of electrical fuses, such as anti-fuses are also useful. The fuse blocks are coupled to the redundant element via a selection circuit 250. The selection circuit selects information for redundancy from one of the fuse blocks.

As described, conventional laser type fuses can only be used prior to packaging of the IC. There may be cases when not all redundancy units with laser type fuse blocks are used. These redundancy units, however, are useless after the IC is packaged, taking up valuable chip area. By providing a redundant element associated with both laser and electrical fuse blocks, the redundant element can be used to repair defective cells before or after packaging. This increases the reparability of the redundant block without increasing the number of redundant elements, thus effectively increasing yields without increasing chip size.

Figure 3:
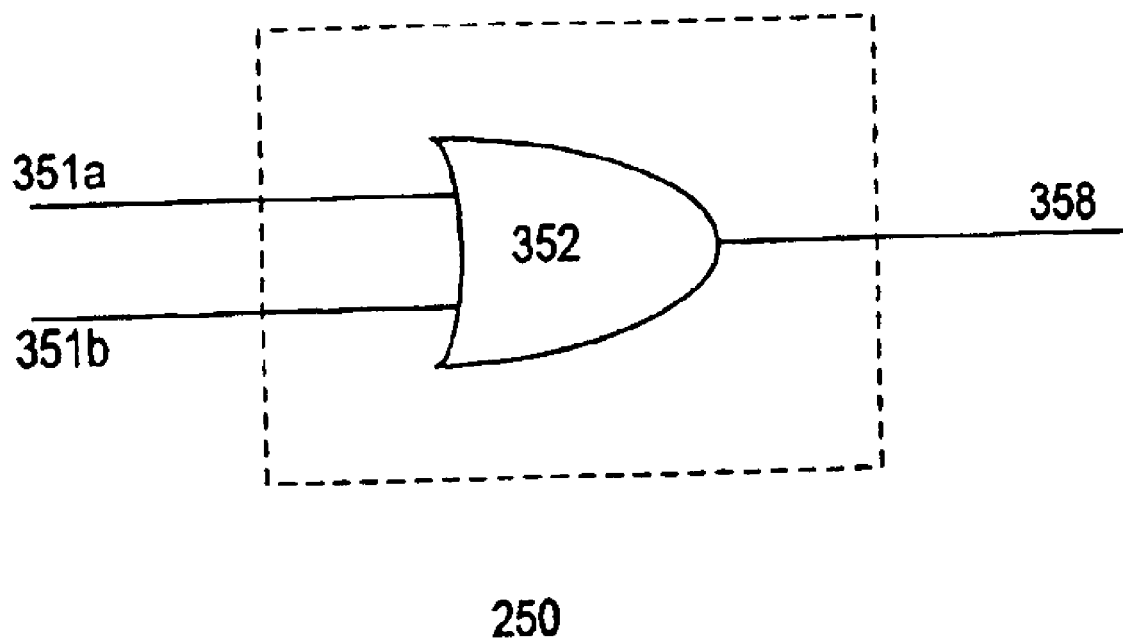
FIGS. 3–4 show select circuits in accordance with different embodiment of the invention.
Figure 4:
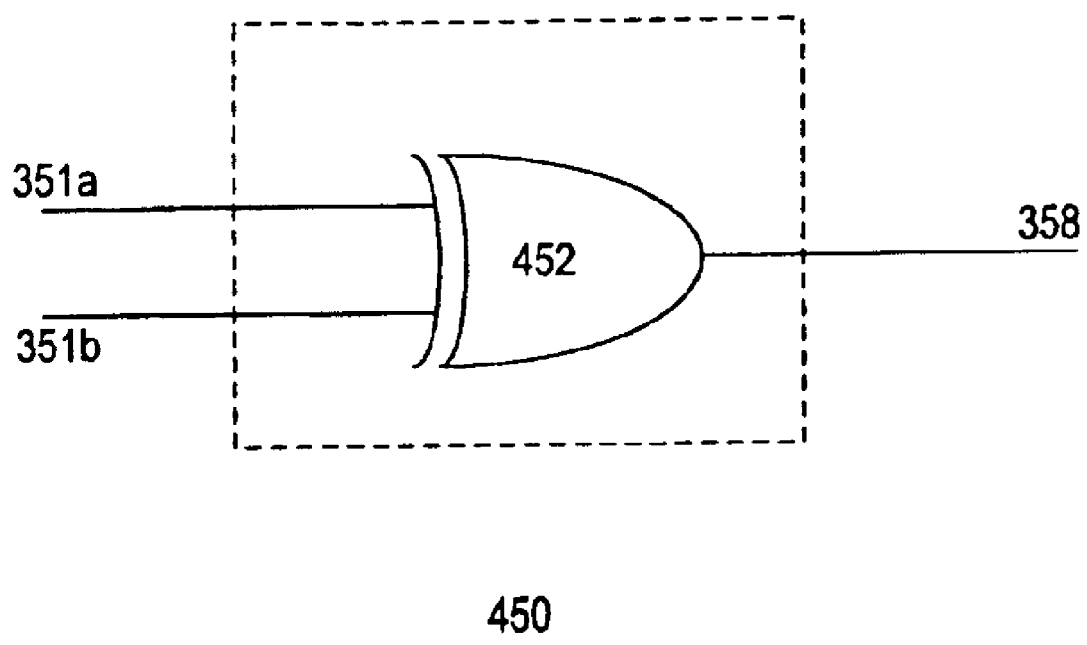

FIG. 3 shows a select circuit 250 in accordance with one embodiment of the invention. As shown, the select circuit comprises an OR-gate 352. The OR-gate comprises first and second input terminals 351a–b and an output terminal 358. One of the input terminals is coupled to the first fuse block and the other is coupled to the second fuse block. The OR gate passes information from either the first or second fuse block. The output is coupled to the redundant element. Alternatively, the select circuit comprises an XOR-gate 450, as shown in FIG. 4. The inputs of the XOR-gate are coupled to the first and second fuse blocks while the output is coupled to the redundant element.

When using an Or or XOR gate as the selection circuit as described in FIGS. 3–4, the tester used for testing the ICs should keep track of which redundancy units have been used. For example, if a redundancy unit is already programmed by one of the fuse blocks, this unit should not be programmed again by the other fuse block. If a redundancy unit is programmed by both fuse blocks, a conflict can occur. This can be tracked by, for example, using a fuse in the first fuse block (e.g., laser fuse block) which indicates that redundancy for the associated redundant element is activated (e.g., master fuse bit). For example, if this fuse bit is blown, then the redundant element has already been programmed by the laser fuse block and should not be programmed again.

Alternatively, a gating circuit can be provided in the select circuit. The gating circuit is coupled to the master fuse bit of the first fuse block and output of the second fuse block. If the first fuse block is used, the gating circuit prevents information from the second fuse block to be used for redundancy. The gating circuit, for example, comprises an AND-gate. The input of the AND-gate is coupled to the master fuse bit of the first fuse block (e.g., laser fuse) and the second fuse block (e.g., electrical fuse) and the output of the gating circuit is coupled to one of the inputs of the OR or XOR gate. If a blown master fuse bit indicates that the laser fuse block is used, then it can be directly coupled to the gating circuit. Otherwise, an inverter can be provided to invert the master fuse bit.

Figure 5:
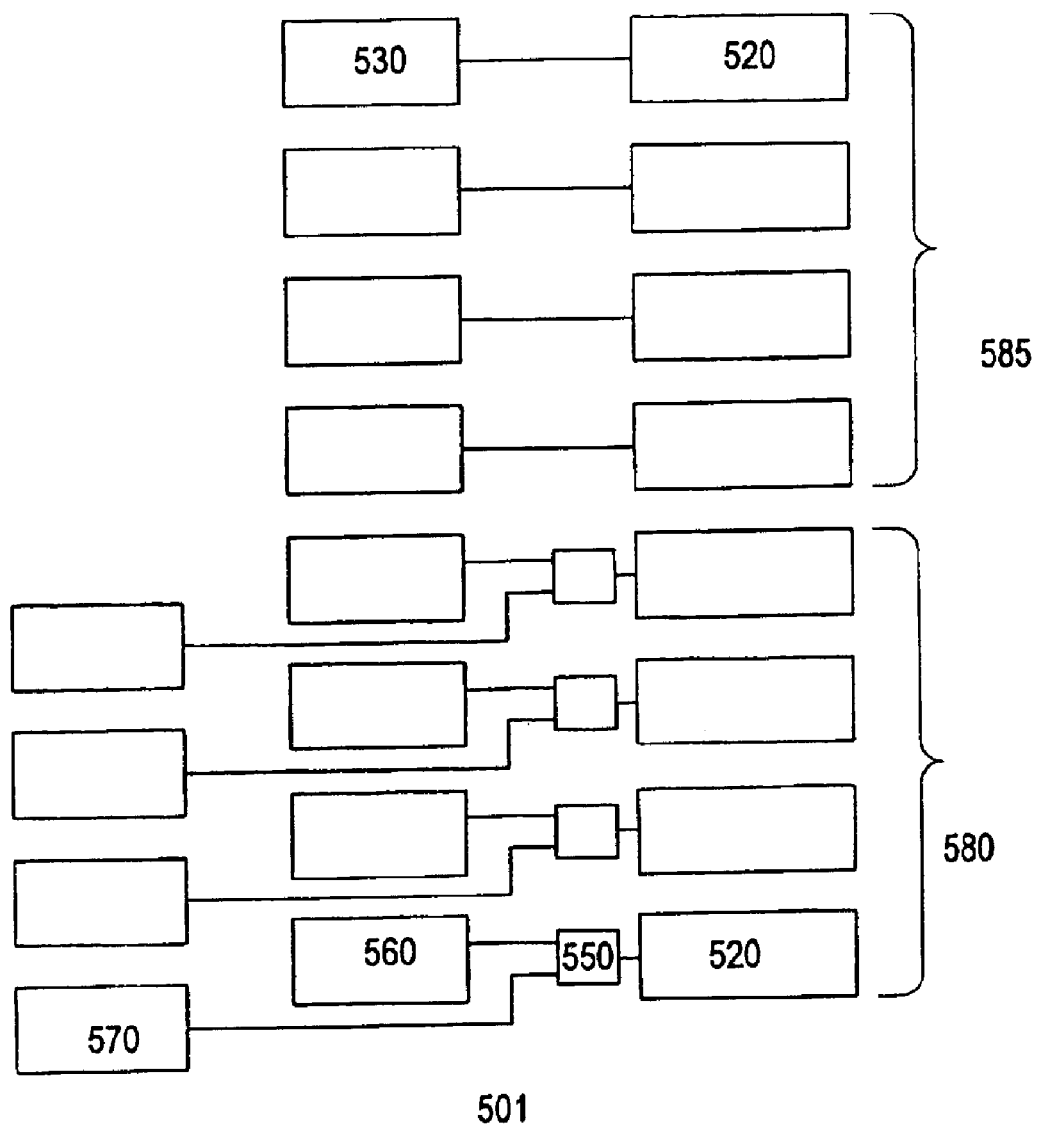
FIG. 5 shows a redundancy scheme in accordance with another embodiment of the invention.

FIG. 5 shows a redundant block 501 in accordance with one embodiment of the invention. The redundant block comprises x number of redundancy units, where x is a whole number greater or equal to 1. The redundant block comprises y first redundancy units 580, where y is a whole number equal to or greater than 1. A first redundancy unit includes a redundant element 520 associated with first and second fuse blocks 560 and 570. In one embodiment, the first fuse block comprises a first type of fuses and the second fuse block comprises a second type of fuses. The first type of fuses, for example, is laser blowable fuses while the second type of fuses is electrical fuses. In one embodiment, the electrical fuses are electrically blowable fuses. The fuse blocks are coupled to the redundant element via a selection circuit 550.

The redundant block can also be provided with second redundancy units 585. In one embodiment, s second redundancy units are provided, where s is equal to x y. A second redundancy unit comprises a redundant element 520 associated with one fuse block 530. The redundant element is exclusively controlled by the fuse block. The fuse block, for example, comprises laser blowable fuses. Providing a fuse block with electrical fuses is also useful. Also, providing some second redundancy units with laser blowable fuse blocks and some with electrical fuse blocks is also useful. This effectively provides a redundant block with three types of redundancy units.

In one embodiment, the redundant block includes y first redundancy units and s second redundancy units. In one embodiment, about half the redundancy units in the block are first redundancy units and the remaining ones are second redundancy units. For example, a redundant block with 8 units (e.g., x=8) has 4 first (e.g., y=4) and 4 second (e.g., s=4) redundancy units. The first redundancy units can be used for repairing defects before or after packaging. In one embodiment, the second redundancy units are used to repair defects before packaging.

If wafer level testing identifies that 5 redundant elements are needed to repair defective memory cells in the memory array, four second type redundancy units and one first type redundancy unit would be used. This would leave 3 first type redundancy units remaining for repairs after the IC has been packaged. However, if less than 3 redundancy units were needed to repair defects at the wafer level testing, the repairs can be completed by using only the second type of redundancy units, still leaving all first type redundancy units for repairs after packaging. The ratio of first and second types of redundancy units can be chosen to optimize design needs. For example, the redundant block can comprise all first type redundancy units.

In another embodiment, the second redundancy units can be used for repairing defects after packaging. For example, the fuse blocks of the secondary units comprise electrical fuses. Alternatively, the secondary units can be divided into two groups, one group for repairing defects before packaging and the other group for repairing defects after packaging. For example, one group would have laser blowable fuses and the other group would have electrical fuses.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A redundancy unit comprising:
    a first fuse block comprising at least one first-type fuse, the first-type fuse is used for programming the redundancy unit prior to packaging;
    a second fuse block comprising at least one second-type fuse, the second-type fuse is used for programming the redundancy unit after packaging;
    a passive selection circuit including first and second input terminals, the first input terminal coupled to the first fuse block, the second input terminal coupled to the second fuse block; and
    a redundant element coupled to the first and second fuse blocks via the passive selection circuit, the passive selection circuit passes information stored in the first fuse block if the first fuse block has been programmed or passes information stored in the second fuse block if the second fuse block has been programmed.

2. The redundancy unit claim 1 repairs defects in an integrated circuit.

3. The redundancy unit of claim 1 wherein the redundant element repairs defects in a memory array.

4. The redundancy unit of claim 3 wherein the redundant element comprises a memory cell.

5. The redundancy unit of claim 3 wherein the redundant element comprises memory cells for row redundancy.

6. The redundancy unit of claim 3 wherein the redundant element comprises a memory cells for column redundancy.

7. The redundancy unit of any one of claim 2–6 wherein the passive selection circuit comprises an OR or an XOR gate.

8. The redundancy unit of claim 2 wherein the first-type fuse comprises a laser blowable fuse and the second-type fuse comprises an electrical fuse.

9. The redundancy unit of claim 8 wherein the first fuse block further includes a master fuse, the master fuse indicating whether or not the redundancy unit has been programmed by the first fuse block.

10. The redundancy unit of claim 9 further comprises a gating circuit, the gating circuit coupled to the second fuse block and the master fuse of the first fuse block, the gating circuit decoupling the second fuse block from the passive selection circuit when the master fuse indicates that the first fuse block has already been programmed.

11. The redundancy unit of claim 10 wherein the gating circuit comprises an AND gate.

12. The redundancy unit of claim 9 wherein the passive selection circuit comprises an OR or an XOR gate.

13. The redundancy unit of claim 12 further comprises a gating circuit, the gating circuit coupled to the second fuse block and the master fuse of the first fuse block, the gating circuit decoupling the second fuse block from the passive selection circuit when the master fuse indicates that the first fuse block has already been programmed.

14. The redundancy unit of claim 13 wherein the gating circuit comprises an AND gate.

15. The redundancy unit of claim 8 wherein the passive selection circuit comprises an OR or an XOR gate.

16. The redundancy unit of claim 2 wherein the first fuse block further includes a master fuse, the master fuse indicating whether or not the redundancy unit has been programmed by the first fuse block.

17. The redundancy unit of claim 16 wherein the passive selection circuit comprises an OR or an XOR gate.

18. The redundancy unit of claim 17 further comprises a gating circuit, the gating circuit coupled to the second fuse block and the master fuse of the first fuse block, the gating circuit decoupling the second fuse block from the passive selection circuit when the master fuse indicates that the first fuse block has already been programmed.

19. The redundancy unit of claim 18 wherein the gating circuit comprises an AND gate.

20. The redundancy unit of claim 16 further comprises a gating circuit, the gating circuit coupled to the second fuse block and the master fuse of the first fuse block, the gating circuit decoupling the second fuse block from the passive selection circuit when the master fuse indicates that the first fuse block has already been programmed.

21. The redundancy unit of claim 20 wherein the gating circuit comprises an AND gate.

22. A redundancy unit comprising:
a first fuse block comprising at least one first fuse;
a second fuse block comprising at least one second fuse; and
a redundant element coupled to the first and second fuse blocks, the redundant element can be programmed by either the first or second fuse blocks, wherein the first fuse comprises a laser blowable fuse and the second fuse comprises an electrical fuse.

23. The redundancy unit of claim 22 further comprises a passive selection circuit coupled to the first and second fuse blocks and the redundancy element, the passive selection circuit selecting either the first or second fuse block for programming the redundancy unit.

24. The redundancy unit of claim 23 wherein the selection circuit comprises an OR or an XOR gate.

25. The redundancy unit of claim 22 wherein the electrical fuse comprises an electrical blowable fuse.

26. The redundancy unit of claim 25 further comprises a passive selection circuit coupled to the first and second fuse blocks and the redundant element, the passive selection circuit selecting either the first or second fuse block for programming the redundancy unit.

27. The redundancy unit of claim 26 wherein the selection circuit comprises an OR or an XOR gate.

28. The redundancy unit of claim 22 wherein the electrical fuse comprises an anti-fuse.

29. The redundancy unit of claim 28 further comprises a selection circuit coupled to the first and second fuse blocks and the redundant element, the selection circuit selecting either the first or second fuse block for programming the redundancy unit.

30. The redundancy unit of claim 29 wherein the selection circuit comprises an OR or an XOR gate.

31. A redundancy unit comprising:
a first fuse block comprising at least one first fuse;
a second fuse block comprising at least one second fuse;
a redundant element coupled to the first and second fuse blocks, the redundant element can be programmed by either the first or second fuse blocks; and
a passive selection circuit coupled to the first and second fuse blocks and the
redundant element, the passive selection circuit selecting either the first or second fuse block for programming the redundancy unit.

32. The redundancy unit of claim 31 wherein the selection circuit comprises an OR or an XOR gate.

33. A redundancy block which includes x number of redundancy units, wherein x is a whole number greater than 1, the redundancy block comprises:
y number of first redundancy units, wherein y is a whole number greater than or equal to 1, but less than or equal to x, wherein a first redundancy unit includes
a first redundancy unit first fuse block comprising at least one first-type fuse;
a first redundancy unit second fuse block comprising at least one second-type fuse; and
a first redundancy unit redundant element coupled to the first and second fuse blocks, the redundant element can be programmed by either the first redundancy unit first or second fuse blocks; and
z number of second redundancy units, whereim z is a whole number and is equal to x-y, wherein a second redundancy unit includes
a second redundancy unit fuse block comprising at least one first-type fuse
a second redundancy unit redundant element coupled to the second redundancy unit fuse block, the second redundancy unit redundant element can be programmed by the second redundancy unit fuse block.

34. The redundancy block of claim 33 is incorporated into an integrated circuit.

35. The redundancy unit of claim 33 or 34 wherein the first-type fuse comprises a laser blowable fuse and the second-type fuse comprises an electrical fuse.

36. The redundancy unit of claim 35 further comprises a passive selection circuit coupled to the first and second fuse blocks and the redundant element, the passive selection circuit selecting either the first or second fuse block for programming the redundancy unit.

37. The redundancy unit of claim 36 wherein the passive selection circuit comprises an OR or an XOR gate.

38. The redundancy unit of claim 33 or 34 further comprises a passive selection circuit coupled to between the fuse blocks and redundancy element, the passive selection circuit selecting either the first or second fuse block for programming the redundancy unit.

39. The redundancy unit of claim 38 wherein the passive selection circuit comprises an OR or an XOR gate.

40. A redundancy unit comprising:
a first fuse block comprising at least one first-type fuse, the first-type fuse is used for programming the redundancy unit prior to packaging;

a second fuse block comprising at least one second-type fuse, the second-type fuse is used for programming the redundancy unit after packaging;

a passive selection circuit including first and second input terminals, the first input terminal coupled to the first fuse block, the second input terminal coupled to the second fuse block, the passive selection circuition comprising an OR or an XOR gate; and a redundant element coupled to the first and second fuse blocks via the passive selection circuit, the passive selection circuit passes information stored in the first fuse block if the first fuse block has been programmed or passes information stored in the second fuse block if the second fuse block has been programmed.

41. The redundancy unit of claim 40 further comprises a gating circuit, the gating circuit coupled to the second fuse block, the gating circuit decoupling the second fuse block from the passive selection circuit if the first fuse block has been programmed.

42. The redundancy unit of claim 40 wherein the first fuse block further includes a master fuse, the master fuse indicating whether or not the redundancy unit has been programmed by the first fuse block.

43. The redundancy unit of claim 42 further comprises a gating circuit, the gating circuit coupled to the second fuse block and the master fuse of the first fuse block, the gating circuit decoupling the second fuse block from the passive selection circuit when the master fuse indicates that the first fuse block has already been programmed.

44. The redundancy unit of claim 43 wherein the gating circuit comprises an AND gate.

45. The redundant unit of claim 40 wherein the first-type fuse comprises a laser blowable fuse and the second-type fuse comprises an electrical fuse.

46. The redundancy unit of claim 45 further comprises a gating circuit, the gating circuit coupled to the second fuse block, the gating circuit decoupling the second fuse block from the passive selection circuit if the first fuse block has been programmed.

47. The redundancy unit of claim 45 wherein the first fuse block further includes a master fuse, the master fuse indicating whether or not the redundancy unit has been programmed by the first fuse block.

48. The redundancy unit of claim 47 further comprises a gating circuit, the gating circuit coupled to the second fuse block and the master fuse of the first fuse block, the gating circuit decoupling the second fuse block from the passive selection circuit when the master fuse indicates that the first fuse block has already been programmed.

49. The redundancy unit of claim 48 wherein the gating circuit comprises an AND gate.

* * * * *